United States Patent
Habara et al.

(10) Patent No.: US 7,292,035 B2
(45) Date of Patent: Nov. 6, 2007

(54) NMR.ESR ANTENNAS AND SPECTROMETERS USING THESE

(75) Inventors: Hideta Habara, Musashino (JP); Minseok Park, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/483,777

(22) Filed: Jul. 11, 2006

(65) Prior Publication Data
US 2007/0007961 A1    Jan. 11, 2007

(30) Foreign Application Priority Data
Jul. 11, 2005   (JP) .............. 2005-201739

(51) Int. Cl.
  *G01V 3/00*   (2006.01)
(52) U.S. Cl. .................................... 324/316
(58) Field of Classification Search ........ 324/300–322; 333/219–235; 343/720–721, 741–744, 753–755, 343/772–792, 824–832, 834–840, 878–893, 343/907, 912
See application file for complete search history.

(56) References Cited

U.S. PATENT DOCUMENTS

| | | | | |
|---|---|---|---|---|
| 3,003,125 A | * | 10/1961 | Bomke et al. | .............. 332/163 |
| 3,931,569 A | * | 1/1976 | Hyde | .............. 324/316 |
| 4,386,054 A | * | 5/1983 | Takeuchi et al. | .............. 422/63 |
| 5,343,150 A | * | 8/1994 | Nakahata et al. | .............. 324/316 |
| 6,101,015 A | * | 8/2000 | Budil et al. | .............. 324/316 |
| 7,205,764 B1 | * | 4/2007 | Anderson et al. | .............. 324/307 |

OTHER PUBLICATIONS

Journal of Magnetic Resonance, 140 pp. 293-299 (1999).
Review of Scientific Instrument, vol. 69, pp. 3924-3937 (1998).
Review of Scientific Instrument, vol. 70, pp. 3681-3683 (1999).

* cited by examiner

*Primary Examiner*—Diego Gutierrez
*Assistant Examiner*—Dixomara Vargas
(74) *Attorney, Agent, or Firm*—Antonelli, Terry, Stout & Kraus, LLP.

(57) ABSTRACT

An NMR/ESR antenna is inserted into a magnet device for generating a static magnetic field, and irradiates a sample with an electromagnetic wave to detect a signal generated from the sample. The NMR/ESR antenna comprises a sample tube, an NMR solenoid coil, an ESR microwave cavity, and a microwave guide. The solenoid coil has a central axis coaxial with a central axis of the ESR microwave cavity, and orthogonal to a direction of a main magnetic field generated by the magnetic device.

9 Claims, 2 Drawing Sheets

NMR·ESR ANTENNAS AND SPECTROMETERS USING THESE

BACKGROUND OF THE INVENTION

The present invention relates to a nuclear magnetic resonance (hereinafter abbreviated as "NMR") and an electron spin resonance (hereinafter abbreviated as "ESR") antenna, and spectrometers using the same.

NMR and ESR apparatuses irradiate a sample placed under a static magnetic field with electromagnetic waves such as radio frequency waves, microwaves or the like, and receive a free induction decay signal generated from the sample to identify the structure of the sample.

In recent years, there have been developed a method of improving the receipt sensitivity using the principle of dynamic nuclear polarization (DNP), a microscope using an ESR apparatus, and the like. The DNP-based method of improving the receipt sensitivity employs an approach which polarizes electron spins of a solid-state sample at extremely low temperature using an ESR apparatus, and transfers the polarization of electron spins to nuclear spins for measurement by an NMR apparatus.

If an apparatus is capable of simultaneously measuring NMR and ESR, a sample need not be moved because an ESR apparatus is first used for polarization and then an NMR apparatus is used for measurement. Also, when a used ESR apparatus can capture images, information on the spectrum of a sample can be acquired by an NMR apparatus simultaneously while an image of the sample is captured by the ESR apparatus. In this way, the simultaneous NMR/ESR measurements can acquire much information such as information on the molecular structure, dynamics, and electronic state of the sample, though the apparatus is complicated as compared with a measurement of one of NMR and ESR.

For simultaneously measuring NMR and ESR, an antenna which supports resonance frequencies of both NMR and ESR is arranged for a sample placed in a magnetic field. Particularly, in a high magnetic field region in which the magnetic field is approximately seven tesla, the resulting ESR resonance frequency is as high as 196 GHz, which belongs to a field referred to as "high magnetic field ESR."

A problem resulting from the formation of high magnetic field ESR is that difficulties are experienced in handling microwaves at 100 GHz or higher. Frequencies at 100 GHz or higher are hardly provided by commercially available standard frequency oscillation sources, and larger losses are produced in transmitting the microwaves through coaxial cables or waveguides. Other difficulties are encountered in designing an antenna for intensively irradiating a sample space with microwaves.

For implementing a high magnetic field ESR apparatus, a frequency source employs a GUNN oscillator, or its multiple-wave magnetron. A microwave is introduced into a magnet by using an oversized waveguide, or spatially propagating a microwave, which is quasi-optically formed into a Gaussian beam, for introduction into the magnet.

An antenna for forming a coupling with a sample may be made using a cylindrical cavity as described in J. Mag. Resonance, 140, 293-299 (1999), or a cavity referred to as "Fabry-Perot type" as described in Rev. Sci. Instrum. 69, 3924-3937 (1998). Also, a Fabry-Perot type cavity having a half mirror with a mesh formed on one side has already been implemented in a high magnetic field ESR apparatus for 200 GHz or higher (see Rev. Sci. Instrum. 70, 3681-3683 (1999).

SUMMARY OF THE INVENTION

When a cylindrical cavity is used, a sample tube should be placed on its central axis, wherein a small amount of sample can only be used because the cavity generally has a diameter of one millimeter or less. Also, the efficiency of the cavity is lower as the frequency is higher. It has been pointed out that at high frequencies of 200 GHz or higher, the cylindrical cavity is degraded in efficiency as compared with the Fabry-Perot type cavity.

On the other hand, the Fabry-Perot type cavity having a half mirror with a mesh formed on one side, as described in Rev. Sci. Instrum. 70, 3681-3683 (1999), imposes constraints that a sample should be placed on a parabolic mirror, so that the mirror must be washed each time a sample is replaced with another one. The Fabry-Perot type cavity also has a problem that it suffers from a bad coupling of a sample with an NMR detection coil when double resonance spectra are captured.

In view of the problems of the prior art, it is an object of the present invention to provide NMR/ESR antennas which are capable of improving a coupling of a sample with an NMR signal detection coil and ESR microwave cavity to efficiently capture NMR/ESR spectra, and spectrometers using the same.

To achieve the above object, the present invention provides an NMR/ESR antenna for irradiating a sample with an electromagnetic wave to detect a signal generated from the sample. The NMR/ESR antenna includes an ESR microwave cavity composed of a pair of opposing reflectors, one of the reflectors having a throughhole formed therethrough for inserting a sample tube (reflector 1), and the other of the reflectors including a microwave guide for introducing a microwave (reflector 2), and an NMR solenoid coil disposed within the cavity such that a central axis of the ESR microwave cavity matches a central axis of the NMR solenoid coil, and such that the central axes are orthogonal to a direction of a static magnetic field. The ESR microwave cavity is composed of two opposing spherical mirrors or parabolic mirrors.

Alternatively, the present invention provides another NMR/ESR antenna which includes an ESR microwave cavity composed of a pair of opposing reflectors, a microwave guide coupled to one of the reflectors for introducing a microwave, and a substrate mounted with an NMR solenoid micro-coil on a central axis of the cavity, and further formed with a miniature flow path having a liquid pool for storing a liquid sample in the substrate.

The NMR/ESR antenna of the present invention may be applied to a probe of an NMR/ESR apparatus, wherein electron spin polarization is transferred to nuclear spin polarization using the ESR microwave cavity, and the nuclear spin polarization is measured using the NMR solenoid coil.

The NMR/ESR antenna of the present invention, which employs the foregoing configuration, can efficiently acquire NMR and ESR spectra at high frequencies and facilitates replacement of a sample with another one.

Other objects, features and advantages of the invention will become apparent from the following description of the embodiments of the invention taken in conjunction with the accompanying drawings.

DESCRIPTION OF THE EMBODIMENTS

In the following, some embodiments of the present invention will be described with reference to the accompanying drawings. However, the present invention is not limited to embodiments described in this specification because a variety of modifications can be made to the invention using technical ideas disclosed in the embodiments.

An NMR apparatus detects a signal of nuclear spins within a sample, whereas an ESR apparatus, which is also referred to as an "electronic paramagnetic resonance apparatus" (EPR apparatus), detects a signal of electronic spins within a sample. Generally, when a sample is placed in a magnetic field of the same intensity, the resonance frequency of an NMR signal is approximately 670 times as high as the resonance frequency of an ESR signal.

For designing a high magnetic field ESR apparatus, a frequency source may employ a GUNN oscillator or its multiple-wave magnetron. A microwave is introduced into a magnet by using an oversized waveguide, or spatially propagating the microwave, which is quasi-optically formed into a Gaussian beam, for introduction into the magnet. Also, an antenna for forming a coupling with a sample is made using a Fabry-Perot type cavity antenna which has spherical or parabolic lenses opposite to each other.

First Embodiment

Figure 2A:
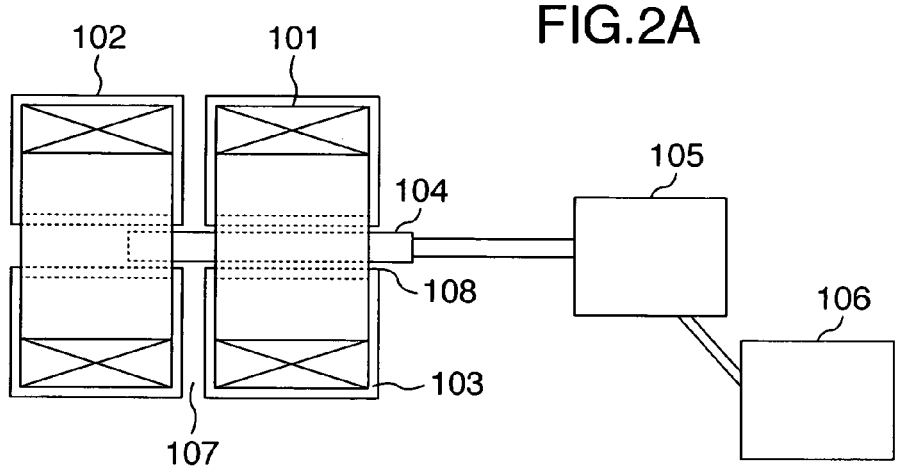
FIGS. 2A-2C are diagrams generally illustrating the configuration of an NMR/ESR apparatus according to the first embodiment.
Figure 2B:
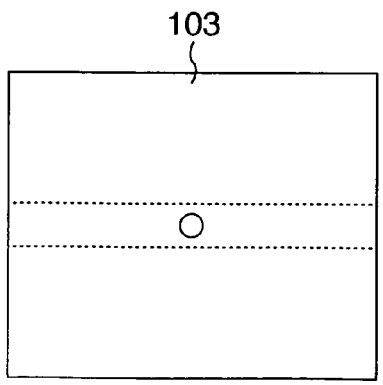
Figure 2C:
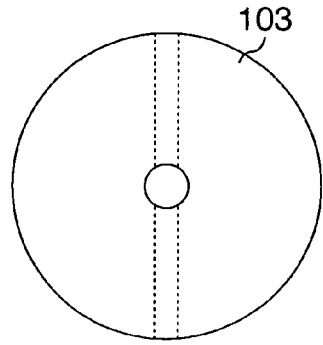

A first embodiment of the present invention will be described. FIGS. 2A-2C are diagrams illustrating the configuration of an NMR/ESR apparatus for a double resonance spectrometer according to the present invention. Specifically, FIG. 2A is a cross-sectional view of the NMR/ESR apparatus when taken from a side; FIG. 2B is a top plan view of a magnet device in FIG. 2A taken from above; and FIG. 2C is a lateral view of the magnet device in FIG. 2A when taken from a direction in which a probe is inserted.

The NMR/ESR apparatus of this embodiment comprises a superconductive magnet 101 for applying a static magnetic field to a sample in a magnet device 103 together with a cryostat container 102. The NMR/ESR apparatus also comprises an NMR/ESR probe 104, inserted into the superconductive magnet device 103, which has a transmit coil for transmitting electromagnetic waves such as radio frequency waves, microwaves or the like to a sample, and a receive coil for receiving a free induction decay signal generated from the sample. The transmit coil and receive coil may be combined into a single coil.

The NMR/ESR apparatus comprises an NMR/ESR transmit/receive circuit 105 connected to the NMR/ESR probe 104 for generating an electromagnetic wave which is emitted from the transmit coil, and performing signal processing based on the free induction decay signal from the receive coil. The NMR/ESR apparatus further comprises an information processing unit 106 for performing a variety of information processing in accordance with the output of the transmit/receive circuit 105.

The magnet device 103 comprises the cryostat container 102, and the superconductive magnet 101 arranged within the cryostat container 102. A coolant such as liquid nitrogen, liquid helium or the like is injected into the cryostat container 102 to cool down the superconductive magnet 101. The superconductive magnet 101 comprises a pair of superconductive coils having a winding shaft in the horizontal direction, and a sample insertion space 107 is defined between the pair of superconductive coils for inserting a sample thereinto. The sample is inserted through a sample tube from above the sample insertion space 107.

Each superconductive coil, forming part of the superconductive magnet 101, is represented by a single-layer magnet in this embodiment for simplifying the description. However, the use of multi-layer superconductive coils is beneficial for improving the uniformity of a resulting magnetic field, though adjustments are required between the respective superconductive coils. Also, the space is defined to extend through the winding shaft of the horizontal superconductive coils, so that the cryostat container 102 is also formed in correspondence to this space.

The NMR/ESR probe 104 is inserted along the probe insertion space 108 of the superconductive magnet 101 and cryostat container 102. Though a detailed illustration is omitted, since the NMR/ESR probe 104 inserts a sample from the normal direction, the employed coils have the sample space in the vertical direction, and are of solenoid type.

With the foregoing configuration, the NMR/ESR apparatus according to this embodiment can irradiate a sample placed under a static magnetic field with an electromagnetic wave for approximately several microseconds, receive a free inductance decay signal generated from the sample based on the electromagnetic wave, process the received signal to measure NMR and ESR.

Figure 1:
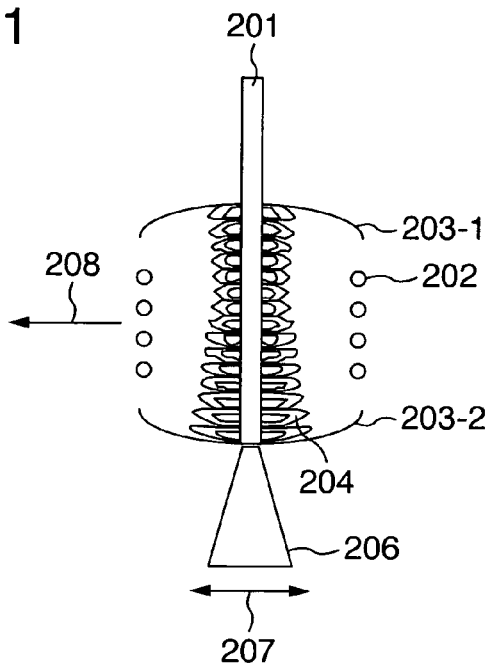
FIG. 1 is a diagram illustrating the configuration of an NMR/ESR antenna according to a first embodiment of the present invention.

FIG. 1 illustrates the configuration of the NMR/ESR probe antenna. The NMR/ESR probe antenna 104 of this embodiment comprises a sample tube 201, an solenoid radio frequency wave coil 202 for NMR, a microwave cavity for ESR 203, and a microwave guide 206. The sample tube 201 is inserted and assembled into the antenna when a sample is analyzed.

The sample tube 201 extends through the center of an upper reflector 203-1 of the microwave cavity 203. The upper reflector 203-1 of the microwave cavity 203 exhibits a high field strength at a central region thereof, so that any hole extending through the center causes a lower efficiency of the microwave cavity. Accordingly, the sample tube should have a shortest possible diameter.

The sample tube 201 is made of a glass tube of approximately three millimeters in diameter, by way of example. On the other hand, a request exists for a larger sample tube because the amount of sample is proportional to the sensitivity. Thus, a trade-off between the efficiency and sensitivity leads to a proper sample tube which has a diameter of approximately three millimeters.

The microwave cavity 203 comprises the upper reflector and a lower reflector opposite thereto which are spaced apart by approximately two centimeters, and has a resonance frequency at approximately 200 GHz. With such a design, the electromagnetic wave has a wavelength of approximately 1.5 millimeters, thus resulting in the surface accuracy of mirror surfaces equal to 15 microns or less, which is approximately 1/100 of the wavelength. While parabolic mirrors are used for the upper and lower reflectors, spherical mirrors may be used instead.

One of the reflectors of the microwave cavity 203 is made movable in the axial direction of the cavity. Specifically, one side of the mirror is moved by a piezo-electric element to control the axial length of the cavity in increments of several microns in order to efficiently generate a standing wave within the cavity in conformity to the wavelength of the incident microwave.

FIG. 1 shows a standing wave 204 of an electromagnetic wave centered at the axis of the cavity 203. The configuration using the sample tube 201 as shown in the first embodiment is effective for a sample which uses an organic solvent, other than water, which exhibits a low microwave absorption coefficient.

However, the standing wave may not be produced in a satisfactory manner depending on contents in the sample tube 201. Particularly, since water fairly absorbs microwaves, a sample tube having a diameter of three millimeters contains an excessive amount of water, thus reducing the efficiency of the cavity in some cases. In this event, a sample tube having a smaller diameter should be used, or a container for storing a sample must be changed in shape (described in a second embodiment).

Unlike before, in this embodiment, the main axis of the microwave cavity 203 and the main axis of the sample tube 201 are directed to be orthogonal to a direction 208 of a main magnetic field. An exemplary application of this structure to the NMR/ESR apparatus in this arrangement will be described below.

Figure 3:
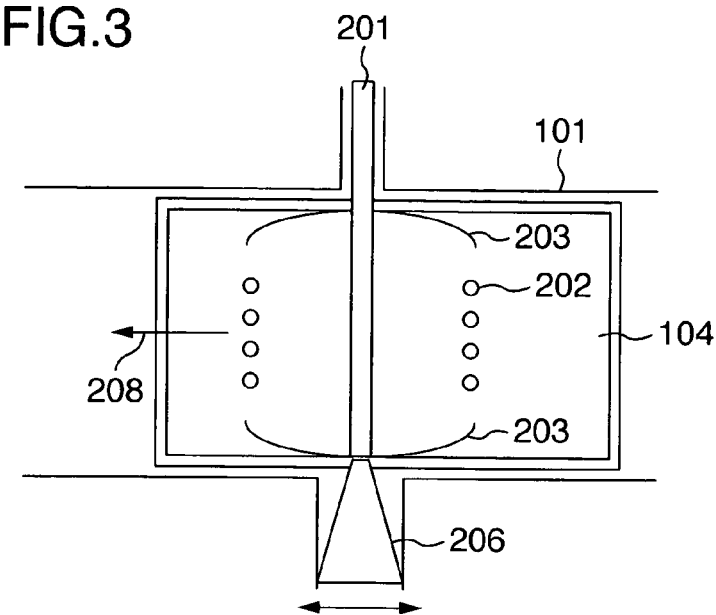
FIG. 3 is a diagram illustrating a layout in which the NMR/ESR antenna of the first embodiment is applied to a probe of the NMR/ESR apparatus.

FIG. 3 illustrates the configuration of the NMR/ESR apparatus which is provided with the NMR/ESR antenna in the form of a probe. The NMR/ESR antenna is wrapped in a housing of a probe 104, and inserted into the probe insertion hole 108 of the magnet 101. The axial direction of the cavity 203 is aligned to a sample insertion space 107 of the magnet 101. Subsequently, a sample tube 201, containing a sample, is inserted from above, while a microwave guide 20 is attached from below.

The foregoing configuration provides the following features, as compared with the conventional systems. First, a radio frequency wave solenoid coil for NMR can be employed. In FIG. 1, the NMR coil 202 shows a cross-section of a quadruple solenoid (helical) coil, but the number of turns of the coil has an optimal value which depends on the frequency and the like. An AC magnetic field produced by the NMR coil 202 must be directed orthogonal to the main magnetic field 208. Also, the solenoid coil can generally take a higher filling factor (filling factor), as compared with a saddle-shaped coil, with the result that the solenoid coil has a higher sensitivity than the saddle-shaped coil. Accordingly, the use of the solenoid coil 202 constitutes a significant feature.

FIG. 1 shows a polarization direction 207 of the magnetic field associated with a microwave incident on the microwave cavity 203. Since the polarization of the magnetic field of the incident electromagnetic wave must be orthogonal to the direction of the main magnetic field 208, the electric field polarization direction 207 runs along the surface of the drawing sheet, as illustrated.

The microwave guide 206 is coupled with a horn antenna for introducing a microwave in a hole formed through the lower parabolic mirror. For example, a horn waveguide corresponding to frequencies 220-325 GHz has inner dimensions of 0.86 millimeters by 0.43 millimeters. Therefore, while the lead-in hole of the microwave guide 206 on the parabolic mirror differs in size depending on the frequency, the lead-in hole should be made slightly larger with reference to the foregoing inner dimensions. However, since difficulties will be encountered in introducing the sample tube 201 through the microwave lead-in hole of 3 millimeters or less, the sample tube is introduced from a side of the cavity 203 and fixed.

Other than the horn antenna, the microwave guide 206 may employ a circular corrugated horn antenna, provided that the polarization does not change in direction. Also, a connection of the microwave cavity 203 with the microwave guide 206 must be designed in consideration of efficiency couplings of the cavity with the incident wave and detected wave. Generally, a larger coupling can provide larger power of incident waves, but the cavity is degraded in efficiency (Q value). A lower Q-value is not preferable because it results in a lower detection sensitivity and excitation efficiency. An appropriate coupling must be designed in consideration of a trade-off between the foregoing factors.

Most preferably in view of the efficiency, a microwave should be optically propagated in the air for introducing the microwave into the microwave guide 206. Generally, coaxial cables and waveguides with a low attenuation factor are available for electromagnetic waves at frequencies of 40 GHz or lower. However, the attenuation factor increases in cables and waveguides at frequencies exceeding 40 GHz, so that a radiowave may be propagated in the air because it will be less attenuated.

When a radiowave is propagated in the air, it cannot be bent, as can by a coaxial cable, so that the degree of freedom decreases in directing the radiowaves. Generally, an electromagnetic beam called a "Gaussian optical system" is designed using an optical system which is approximated to a Gaussian propagation wave, and a microwave is appropriately introduced into the microwave guide 206 from the outside using lenses made of Teflon (registered trademark) or the like, mirrors, mesh type polarization mirrors and the like.

The NMR/ESR antenna according to this embodiment is applied to the NMR/ESR probe 104 which is inserted into the magnet device 103 of the horizontal NMR/ESR apparatus illustrated in FIGS. 2A-2C. A sample is supplied from the sample tube 201 which is mounted in an upper area of the apparatus, and a microwave is introduced from the microwave guide 206 on the opposite side. Since the ESR microwave cavity 203 transfers electron spins generated from the sample to nuclear spins, they can be measured by the NMR solenoid coil 202.

The ESR/NMR double resonance measurement is one type of spectrometry which can be implemented by providing the configuration of the present invention with an external magnetic field coil. The ESR spectrum is measured while the magnetic field is swept in a continuous wave mode, and the sample is irradiated with a radio frequency wave corresponding to an NMR signal during the measurement to observe a change in the spectrum.

A highly sensitive NMR measurement using dynamic nuclear polarization can be implemented by adding a cooler and the like to the configuration of this embodiment. A sample is cooled down to cryogenic temperatures, and irradiated with an ESR resonance microwave to polarize electron spins within the sample. The electron spin polarization transfers to polarization of nuclear spins through interactions such as a solid-state effect, and a highly sensitive NMR measurement can be made after the solidified sample solvent is rapidly unfrozen.

Simultaneous ESR imaging and NMR spectrometric measurement can be implemented by adding a gradient magnetic coil for capturing image information to this embodiment. An image capture apparatus utilizing a nuclear magnetic resonance signal is well known from a medical MRI apparatus. In recent years, immense advances have been made in an image capture technology which utilizes electron spin resonance signals, and at present, an image can be captured at a resolution of ten-micron square. When this embodiment is applied to an ESR system, the resulting system can trace a change over time of an NMR signal of a protein or the like while capturing image information of a vegetable tissue or the like.

Second Embodiment

Figure 4A:
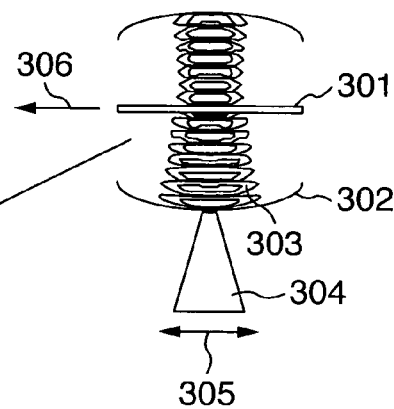
FIGS. 4A-4C are diagrams illustrating the configuration of an NMR/ESR antenna according to a second embodiment of the present invention.
Figure 4B:
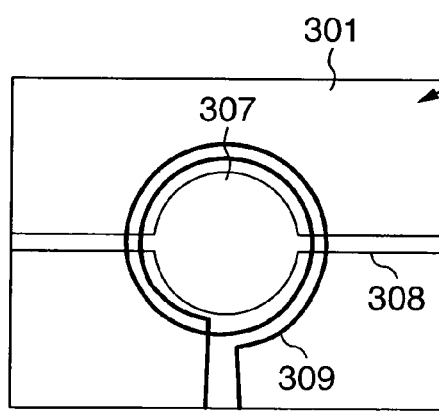
Figure 4C:
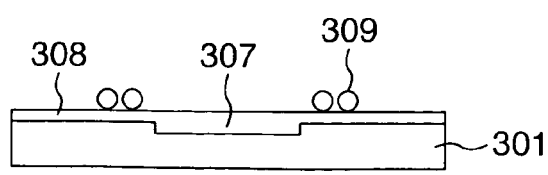

Next, another embodiment will be described with reference to FIGS. 4A-4C which illustrate the configuration of an NMR/ESR probe antenna, wherein a sample area and an NMR antenna coil are modified in shape. FIG. 4A generally illustrates the configuration of an NMR/ESR probe; FIG. 4B is a top plan view of a plate formed with a micro-coil and a miniature flow path; and FIG. 4C is a side view of FIG. 4B.

The NMR/ESR probe 300 according to this embodiment comprises a plate 301 formed with a micro-coil and a miniature flow path; an ESR microwave cavity 302 made up of a pair of an upper and a lower mirror; and a microwave guide 304. As a microwave is introduced into the NMR/ESR probe 300, an electromagnetic standing wave 303 develops within the cavity. The plate 301 is formed with an NMR solenoid micro-coil 309, and a miniature flow path 308 having a liquid pool 307. Arrows indicative of a direction 306 of a main magnetic field and an orientation 305 of microwave polarization are similar to those in FIG. 1.

When a sample is a water solvent, the sample is limited in amount because it exhibits a large attenuation factor for microwaves. In this event, when the NMR/ESR probe antenna is in a similar configuration to the first embodiment, the cylindrical sample tube 201 must have a diameter equal to or less than approximately one millimeter, resulting in a larger distance from the NMR radio frequency wave coil and an attendant problem of a lower sensitivity.

To avoid this problem, in this embodiment, a sample is held in the liquid pool 307 of the miniature flow path 308 formed in the flat plate 301, and an NMR signal is captured by the micro-coil 309 arranged in close proximity to the liquid pool 307.

A liquid sample is replaced by passing the liquid from an inlet to an outlet of the miniature flow path 308. The plate 301 has a thickness of approximately one millimeter, and is arranged such that the flat surface is perpendicular to the optical axis of the microwave cavity 302.

In this configuration, an electromagnetic standing wave produced within the microwave cavity 302 has a node part and a belly part, wherein the highest sensitivity is provided when the sample is placed in the belly part. For this reason, the plate 301 preferably has a mechanism for moving in the optical axis direction of the microwave cavity 302 in microns. Other exemplary applications are similar to those of the first embodiment.

The NMR/ESR antenna according to this embodiment is applied to the NMR/ESR probe 104 which is inserted into the magnetic device 103 illustrated in FIGS. 2A-2C. In a horizontal NMR/ESR apparatus, a sample is supplied from an overlying probe insertion space 108 or sample insertion space 107 through the miniature flow path 308, while a microwave is introduced from the insertion space 107 through the microwave guide 206.

The superconductive magnet device in the NMR/ESR apparatus in the first and second apparatuses is a superconductive magnet which has a winding shaft in the horizontal direction. However, as long as the electromagnetic transmit/receive apparatus of this embodiment is used, the present invention can also be applied to an NMR apparatus such as a superconductive magnet which has a winding shaft in the vertical direction.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An NMR/ESR antenna for irradiating a sample with an electromagnetic wave to detect a signal generated from the sample, said NMR/ESR antenna comprising:
   an ESR microwave cavity composed of a pair of opposing reflectors, one of said reflectors having a throughhole formed therethrough for inserting a sample tube, and the other of said reflectors including a microwave guide for introducing a microwave; and
   an NMR solenoid coil disposed within said cavity such that a central axis of said ESR microwave cavity matches a central axis of said NMR solenoid coil, and such that said central axes are orthogonal to a direction of a static magnetic field.

2. An NMR/ESR antenna according to claim 1, wherein said sample tube is disposed along the central axis of said ESR microwave cavity.

3. An NMR/ESR antenna according to claim 1, wherein said microwave guide comprises a horn antenna for introducing a microwave, said horn antenna being coupled to a hole formed through the center of said one of said reflectors.

4. An NMR/ESR antenna according to claim 1, wherein said reflectors comprise a parabolic mirror or a spherical mirror.

5. An NMR/ESR antenna for irradiating a sample with an electromagnetic wave to detect a signal generated from the sample when said antenna is inserted into a magnetic device for generating a static magnetic field, said antenna comprising:
   an ESR microwave cavity composed of a pair of opposing reflectors;
   a microwave guide coupled to one of said reflectors for introducing a microwave; and
   a substrate mounted with an NMR solenoid micro-coil on a central axis of said cavity, said substrate being further formed with a miniature flow path having a liquid pool for storing a liquid sample in said substrate.

6. An NMR/ESR antenna according to claim 5, wherein said NMR solenoid micro-coil has a central axis which passes through the center of said liquid pool of said miniature flow path, and the central axis of said NMR solenoid micro-coil is orthogonal to a direction of a main magnetic field.

7. An NMR/ESR antenna according to claim 5, further comprising an adjusting mechanism for placing said substrate such that a flat surface thereof is perpendicular to an optical axis of said ESR microwave cavity, and for allowing said substrate to move in the direction of said optical axis.

8. An analyzer comprising:

a magnet device for generating a static magnetic field;

an NMR/ESR probe inserted into said magnetic device for irradiating a sample with an electromagnetic wave to detect a signal generated from the sample; and an electromagnetic wave transmit/receive unit electromagnetically connected to said probe, wherein said NMR/ESR probe comprises the NMR/ESR antenna according to claim 1.

9. An analyzer comprising:

a magnet device for generating a static magnetic field;

an NMR/ESR probe inserted into said magnetic device for irradiating a sample with an electromagnetic wave to detect a signal generated from the sample; and an electromagnetic wave transmit/receive unit electromagnetically connected to said probe, wherein said NMR/ESR probe comprises the NMR/ESR antenna according to claim 5.

* * * * *